(12) United States Patent
Nagamine et al.

(10) Patent No.: US 9,657,226 B2
(45) Date of Patent: May 23, 2017

(54) COMPOSITION FOR ETCHING TREATMENT OF RESIN MATERIAL

(71) Applicant: OKUNO CHEMICAL INDUSTRIES CO., LTD., Osaka-shi, Osaka (JP)

(72) Inventors: Shingo Nagamine, Osaka (JP); Koji Kita, Osaka (JP); Kuniaki Otsuka, Osaka (JP)

(73) Assignee: OKUNO CHEMICAL INDUSTRIES CO., LTD., Osaka-shi (JP)

( * ) Notice: Subject to any disclaimer, the term of this patent is extended or adjusted under 35 U.S.C. 154(b) by 0 days.

(21) Appl. No.: 14/655,555

(22) PCT Filed: Oct. 16, 2014

(86) PCT No.: PCT/JP2014/077580
§ 371 (c)(1),
(2) Date: Jun. 25, 2015

(87) PCT Pub. No.: WO2015/060196
PCT Pub. Date: Apr. 30, 2015

(65) Prior Publication Data
US 2015/0344777 A1    Dec. 3, 2015

(30) Foreign Application Priority Data

Oct. 22, 2013  (JP) ................. 2013-219456
Dec. 10, 2013  (JP) ................. 2013-255121
Feb. 28, 2014  (JP) ................. 2014-038620

(51) Int. Cl.
| | |
|---|---|
| C09K 13/00 | (2006.01) |
| C09K 13/04 | (2006.01) |
| C03C 15/00 | (2006.01) |
| C03C 25/68 | (2006.01) |
| C23C 18/16 | (2006.01) |
| C23F 3/02 | (2006.01) |
| C23F 1/14 | (2006.01) |
| C23C 18/24 | (2006.01) |
| C25B 1/28 | (2006.01) |
| C08J 7/14 | (2006.01) |
| C23C 18/20 | (2006.01) |
| H01L 21/306 | (2006.01) |
| H01L 21/02 | (2006.01) |
| C23C 18/30 | (2006.01) |
| C25D 5/14 | (2006.01) |
| C23C 18/28 | (2006.01) |
| C23C 18/32 | (2006.01) |
| C23C 18/38 | (2006.01) |

(52) U.S. Cl.
CPC ............... *C09K 13/00* (2013.01); *C08J 7/14* (2013.01); *C09K 13/04* (2013.01); *C23C 18/1641* (2013.01); *C23C 18/2086* (2013.01); *C23C 18/24* (2013.01); *C23F 1/14* (2013.01); *C23F 3/02* (2013.01); *C25B 1/28* (2013.01); *C23C 18/1653* (2013.01); *C23C 18/285* (2013.01); *C23C 18/30* (2013.01); *C23C 18/32* (2013.01); *C23C 18/38* (2013.01); *C25D 5/14* (2013.01); *H01L 21/02052* (2013.01); *H01L 21/30604* (2013.01)

(58) Field of Classification Search
None
See application file for complete search history.

(56) References Cited

U.S. PATENT DOCUMENTS

| | | | |
|---|---|---|---|
| 5,110,355 A | 5/1992 | Pendleton | |
| 5,198,096 A | 3/1993 | Foust et al. | |
| 6,454,954 B1 | 9/2002 | Brewster et al. | |
| 2004/0112755 A1* | 6/2004 | Czeczka | ............... H05K 3/424 205/158 |
| 2007/0298170 A1 | 12/2007 | Kronenberg et al. | |
| 2009/0092757 A1 | 4/2009 | Satou et al. | |
| 2009/0176022 A1 | 7/2009 | Shimizu | |

(Continued)

FOREIGN PATENT DOCUMENTS

| | | | |
|---|---|---|---|
| EP | 2657367 | * | 10/2013 |
| JP | 50-089476 A | | 7/1975 |
| JP | 61-087899 A | | 5/1986 |
| JP | 61-501460 A | | 7/1986 |
| JP | 02-053967 U | | 4/1990 |
| JP | 05-243742 A | | 9/1993 |
| JP | 06-010197 A | | 1/1994 |
| JP | 2000-013000 A | | 1/2000 |
| JP | 2002-124753 A | | 4/2002 |
| JP | 2002-530529 A | | 9/2002 |
| JP | 2003-277941 A | | 10/2003 |
| JP | 2004-335879 A | | 11/2004 |
| JP | 2008-31513 A | | 2/2008 |
| JP | 4291353 B2 | | 7/2009 |

(Continued)

OTHER PUBLICATIONS

International Search Report dated Dec. 22, 2014 issued in corresponding application No. PCT/JP2014/077580 (1 page).

(Continued)

*Primary Examiner* — Stephanie Duclair
(74) *Attorney, Agent, or Firm* — Westerman, Hattori, Daniels & Adrian, LLP

(57) ABSTRACT

The present invention provides a composition for etching treatment of a resin material, the composition comprising an aqueous solution having a permanganate ion concentration of 0.2 mmol/L or more and a total acid concentration of 10 mol/L or more, and the aqueous solution satisfying at least one of the following conditions (1) to (3):
(1) containing an organic sulfonic acid in an amount of 1.5 mol/L or more,
(2) setting the divalent manganese ion molar concentration to 15 or more times higher than the permanganate ion molar concentration, and
(3) setting the addition amount of an anhydrous magnesium salt to 0.1 to 1 mol/L.

The composition for etching treatment of the present invention is a composition containing no hexavalent chromium and having excellent etching performance and good bath stability.

21 Claims, No Drawings

(56) References Cited

U.S. PATENT DOCUMENTS

2010/0155255 A1     6/2010  Nagao et al.
2013/0186862 A1*    7/2013  Pearson .................... C25C 1/10
                                                          216/83

FOREIGN PATENT DOCUMENTS

| JP | 2009-228083 A | 10/2009 |
| JP | 2010-121143 A | 6/2010 |
| JP | 2010-535935 A | 11/2010 |
| JP | 4663394 B2 | 4/2011 |
| JP | 4786708 B2 | 10/2011 |
| JP | 4849420 B2 | 1/2012 |
| JP | 5131683 B2 | 1/2013 |
| JP | 5339023 B2 | 11/2013 |
| WO | 92/20204 A1 | 11/1992 |
| WO | 00/29646 A1 | 5/2000 |
| WO | 2008/132926 A1 | 11/2008 |
| WO | 2009/023628 A2 | 2/2009 |
| WO | 2013135863 * | 9/2013 |

OTHER PUBLICATIONS

Extended (Supplementary) European Search Report dated Aug. 1, 2016, issued in counterpart European Patent Application No. 14855525.3. (7 pages).

"Permanganate Desmearing", Surface Technique Handbook, 1998, pp. 329-330 (w/partial translation).

"Etching", Electroless Plating (Foundation and Application), 1994, p. 133 (w/partial translation).

* cited by examiner

COMPOSITION FOR ETCHING TREATMENT OF RESIN MATERIAL

TECHNICAL FIELD

The present invention relates to a composition for etching treatment that is a pretreatment of electroless plating treatment of a resin material such as a resin substrate or a molded resin article.

BACKGROUND ART

Molded resin articles have been used as automobile components in recent years to reduce automobile weight. Resins such as ABS resins, PC/ABS resins, PPE resins, and polyamide resins have been used to achieve this object, and molded resin articles are often plated with copper, nickel, or the like to provide a high-quality impression and beautiful appearance. Further, a method for plating copper or the like on a resin substrate is used as a method for forming a conductor circuit by providing a resin substrate with conductivity.

A common method for plating a resin material such as a resin substrate or a molded resin article comprises degreasing and etching the molded article, optionally followed by neutralization and predipping, and then applying an electroless plating catalyst using a colloidal solution containing a tin compound and a palladium compound, optionally followed by activation (treatment with an accelerator), to perform electroless plating and electroplating sequentially.

In this case, a chromic acid mixture containing a mixed solution of chromium trioxide and sulfuric acid has been widely used as an etching treatment agent. However, chromic acid mixtures, which contain toxic hexavalent chromium, adversely affect work environments. Moreover, safe disposal of the liquid waste requires reduction of the hexavalent chromium to a trivalent chromium ion, followed by neutralization and precipitation, thus requiring complicated treatment for the disposal of the liquid waste. Therefore, in consideration of workplace safety and adverse effects of the liquid waste on the environment, avoiding the use of chromic acid-containing etching solutions is preferable.

Etching solutions containing a permanganate salt as an active ingredient are known as etching solutions that can be used in place of chromic acid mixtures. For example, Patent Literature 1 listed below discloses an acid etching solution containing a permanganate salt. Patent Literature 1 also teaches that various inorganic and organic acids can be used for adjusting the pH of the etching solution, and that sulfuric acid was used to adjust the pH to 1 or less in the Examples. Patent Literature 2 discloses an etching treatment agent containing a permanganate salt and an inorganic acid. However, such simple acid etching solutions containing a permanganate salt and an inorganic acid have poor bath stability, and the permanganate salt easily decomposes to generate sediment, thereby greatly reducing etching performance in short-term use.

Patent Literature 3 discloses an etching solution containing a permanganate salt and a periodic acid or a salt thereof, and having a pH of 2 or less, and that this etching solution improves bath stability. However, in the etching treatment of a resin material using the etching solution, an iodic acid, which is a by-product, reduces a permanganate ion, which is an active ingredient, thereby changing the bath composition, thus sometimes reducing etching performance.

Patent Literature 4 discloses a plastic surface modifier containing permanganic acid, phosphoric acid, and nitric acid, and optionally perchloric acid. Patent Literature 4 teaches that the use of the surface modifier increases the adsorption amount of a catalyst to a substrate in the catalyst application step, and improves deposit of plating; however, it nowhere discloses a method for inhibiting decomposition of permanganic acid.

As described above, various compositions are known as etching solutions without containing hexavalent chromium; however, the etching performance of the etching solution containing a permanganate salt is easily reduced by composition change over time, and further improvement in bath stability is desired.

CITATION LIST

Patent Literature

PTL 1: JP2009-228083A
PTL 2: JP2008-31513A
PTL 3: WO2008/132926
PTL 4: U.S. Pat. No. 4,786,708

SUMMARY OF INVENTION

Technical Problem

The present invention has been made in view of the state of the prior art. A primary object of the present invention is to provide a novel composition for etching treatment that comprises no hexavalent chromium and has excellent etching performance on various resin materials, the composition having good bath stability and simple bath control.

Solution to Problem

The present inventors carried out extensive research to achieve the above object. As a result, they found the following. In an aqueous acid solution having a permanganate ion concentration in a predetermined range and an acid concentration in the bath of 10 mol/L or more, when the organic sulfonic acid concentration is 1.5 mol/L or more, when the divalent manganese ion molar concentration is about 15 times higher than the permanganate ion molar concentration, or when an anhydrous magnesium salt is added in an amount of 0.1 to 1 mol/L, good etching performance on resin materials is attained, and permanganate ion decomposition is inhibited to significantly improve bath stability, which enables maintaining excellent etching performance for a long period of time. As a result of the extensive research, the present invention has been accomplished based on this finding.

More specifically, the present invention provides the following composition for etching treatment of a resin material, an etching treatment process, and a plating process.
Item 1. A composition for etching treatment of a resin material, the composition comprising an aqueous solution having a permanganate ion concentration of 0.2 mmol/L or more and a total acid concentration of 10 mol/L or more, and the aqueous solution satisfying at least one of the following conditions (1) to (3):
(1) containing an organic sulfonic acid in an amount of 1.5 mol/L or more,
(2) setting the divalent manganese ion molar concentration to 15 or more times higher than the permanganate ion molar concentration, and
(3) setting the addition amount of an anhydrous magnesium salt to 0.1 to 1 mol/L.

Item 2. The composition according to Item 1, wherein the permanganate ion is formed by subjecting a divalent manganese ion to electrolytic oxidation in the aqueous solution.

Item 3. The composition according to item 1, wherein the permanganate ion is formed by dissolving a permanganate salt in the aqueous solution.

Item 4. The composition according to any one of Items 1 to 3, wherein the aqueous solution satisfies condition (1) of Item 1, and the organic sulfonic acid is an aliphatic sulfonic acid having one to five carbon atoms.

Item 5. The composition according to item 1, wherein the aqueous solution satisfies condition (2) of Item 1, and the aqueous solution is prepared by adding a permanganate salt to an aqueous acid solution containing a divalent manganese ion.

Item 6. The composition according to Item 1, wherein the aqueous solution satisfies condition (3) of Item 1, and the anhydrous magnesium salt is at least one member selected from the group consisting of anhydrous magnesium sulfate, anhydrous magnesium chloride, and anhydrous magnesium nitrate.

Item 7. An etching treatment process of a resin material, comprising bringing the composition according to any one of Items 1 to 6 into contact with a surface of a resin material to be treated.

Item 8. A process for plating a resin material, comprising etching the resin material by the process of Item 7, then applying an electroless plating catalyst, and subsequently performing electroless plating.

Item 9. A process for controlling the composition according to any one of Items 1 to 6, the process comprising condensing the composition by heating when the volume of the composition is increased.

Item 10. A process for controlling the composition according to any one of Items 1 to 6, the process comprising blowing ozone gas into the composition when the permanganate ion concentration in the composition is decreased.

The composition for etching treatment of the present invention is an aqueous acid solution having a permanganate ion concentration of about 0.2 mmol/L or more and a total acid concentration of 10 mol/L or more.

The aqueous acid solution having such a permanganate ion concentration range can exhibit excellent etching performance on various resin materials. In particular, the permanganate ion concentration in the composition for etching treatment of the present invention is preferably about 1 mmol/L or more.

In a general aqueous acid solution, a permanganate ion tends to gradually decompose; however, in the composition for etching treatment of the present invention, when the total acid concentration is 10 mol/L or more, permanganate ion decomposition can be inhibited by satisfying at least one of the following conditions: setting the organic sulfonic acid concentration to 1.5 mol/L or more, setting the divalent manganese ion molar concentration to about 15 times or more higher than the permanganate ion molar concentration, or setting the addition amount of an anhydrous magnesium salt to 0.1 to 1 mol/L. As a result, the bath stability is improved, and stable etching performance can be exhibited. Any one of the following conditions may be satisfied, but two or all of the conditions can be simultaneously satisfied: the concentration of the organic sulfonic acid is 1.5 mol/L or more, the divalent manganese ion molar concentration is about 15 times or more higher than the permanganate ion molar concentration, and the addition amount of the anhydrous magnesium salt is 0.1 to 1 mol/L.

In the composition for etching treatment of the present invention, the upper concentration limit of permanganate ion that can be stably present in the bath is about 6 mmol/L, and the concentration of permanganate ion that can be stably present in the bath is not increased any more even when the addition of a permanganate salt to the bath is increased.

However, when the permanganate salt is used as a starting material in the composition for etching treatment of the present invention, a permanganate ion in an amount exceeding 6 mmol/L can be present in the bath while preparing the bath, and good etching performance can be attained even under such conditions. In this case, however, since the permanganate ion decomposes over time and thus changes etching performance, to exhibit stable etching performance, the bath after preparation is preferably maintained for a certain period of time until the permanganate ion concentration becomes stable, and then used for etching treatment. For example, the bath is preferably maintained at a temperature for etching treatment, i.e., at about 30 to 70° C., for at least about one hour to make the permanganate ion concentration stable at 6 mmol/L or less, and then used for etching treatment.

The permanganate ion concentration in the bath can be determined by using a redox titration method with an ascorbic aqueous acid solution. In a specific measurement method, 2.0 g/L of an ascorbic aqueous acid solution is added dropwise to 20 ml of a target composition for etching treatment, and the permanganate ion concentration can be obtained according to the following formula based on the dropwise addition amount of the aqueous ascorbic acid solution obtained when the color of the composition changes from reddish purple to colorless and transparent.

Permanganate ion concentration (mmol/L)=dropwise addition amount of 2.0 g/L ascorbic acid (ml)×0.227

The composition for etching treatment of the present invention is explained in detail below for a case where the organic sulfonic acid concentration is 1.5 mol/L or more, the divalent manganese ion concentration is 10 times or more higher than the permanganate ion concentration, and the addition amount of an anhydrous magnesium salt is 0.1 to 1 mol/L.

(1) Setting the Organic Sulfonic Acid Concentration to 1.5 Mol/L or More

In the composition for etching treatment of the present invention, permanganate ion decomposition can be inhibited by setting the organic sulfonic acid concentration in the etching treatment agent to about 1.5 mol/L or more while satisfying the conditions that the permanganate ion concentration is about 0.2 mmol/L or more and the total acid concentration is 10 mol/L or more. As a result, good etching performance on resin materials can be exhibited, bath stability can be significantly improved, and excellent etching performance can be stably exhibited for a long period of time.

Examples of the organic sulfonic acid include aliphatic sulfonic acids having about one to five carbon atoms, such as methane sulfonic acid, ethane sulfonic acid, propane sulfonic acid, and pentane sulfonic acid; aromatic sulfonic acids such as toluene sulfonic acid, pyridine sulfonic acid, and phenol sulfonic acid; etc. Of these, aliphatic sulfonic acids are particularly preferable. The organic sulfonic acids can be used singly or in a combination of two or more.

As described above, the organic sulfonic acid concentration must be about 1.5 mol/L, preferably about 2 mol/L, and more preferably about 4 mol/L.

In the composition for etching treatment of the present invention, the total concentration of the one or more acid components including an organic sulfonic acid must be about 10 mol/L, and is preferably about 12 mol/L. For example, when the organic sulfonic acid alone is used as an acid component, the concentration of the organic sulfonic acid may be about 10 mol/L. When the organic sulfonic acid is used in combination with an inorganic acid, the concentration of the organic sulfonic acid is determined as 1.5 mol/L or more, and the total concentration of the organic sulfonic acid and the inorganic acid may be determined as 10 mol/L or more. The inorganic acid is not particularly limited, and examples include sulfuric acid, hydrochloric acid, nitric acid, phosphoric acid, hydrofluoric acid, boric acid, etc. These inorganic acids can be used singly or in a combination of two or more.

The upper limit of the total concentration of the one or more acid components including the organic sulfonic acid is not particularly limited, and may be the limit of the dissolubility of the acid components to be used. However, a large acid component amount may be disadvantageous in terms of costs. Accordingly, the upper limit of the total acid concentration may be generally about 15 mol/L.

Usable examples of the method for preparing the composition for etching treatment of the present invention containing the permanganate ion in the concentration range described above include a method for directly adding a permanganate salt to form a permanganate ion in an aqueous solution, a method for subjecting a divalent manganese salt-containing aqueous solution to electrolytic oxidation to form a permanganate ion in an aqueous solution, etc.

In the method for directly adding a permanganate salt, a water-soluble permanganate salt such as sodium permanganate and potassium permanganate can be used as a permanganate salt. These permanganate salts can be used singly or in a combination of two or more.

The addition amount of the permanganate salt is an amount such that about 0.2 mmol/L or more of permanganate ion is stably present in the bath. As described above, in the composition for etching treatment of the present invention, up to about 6 mol % of manganese element contained in the bath can be stably present in the bath as a permanganate ion. Accordingly, when a permanganate salt alone is contained as a manganese starting material, the addition amount of the permanganate salt may be determined as about 3.3 mol/L or more to stably present about 0.2 mmol/L or more of permanganate ion in the bath. To make the concentration of the stably present permanganate ion about 6 mmol/L, the addition amount of the permanganate salt may be determined as about 100 mmol/L.

The permanganate salt may be added together with another soluble manganese salt. In this case, based on the total mole number of manganese elements contained in the permanganate salt and another soluble manganese salt, about 6 mol % of manganese elements at the maximum can be stably present in the bath as a permanganate salt. Accordingly, the amount of the permanganate salt is determined so that the target permanganate ion concentration or more can be obtained, and another soluble salt other than permanganate salt can be also used. For example, to make the concentration of permanganate ion stably present in the bath about 6 mmol/L, the concentration of the permanganate salt added to the bath is determined as about 6 mmol/L or more, and the total concentration of manganese elements contained in the permanganate salt and another soluble manganese salt may be determined as about 100 mmol/L. Usable examples of another soluble manganese salt include manganese sulfate (II), manganese chloride (II), manganese carbonate (II), and like water-soluble divalent manganese salts. These water-soluble manganese salts can be used singly or in a combination of two or more.

In the method for subjecting a divalent manganese salt-containing aqueous solution to electrolytic oxidation to form a permanganate ion, an aqueous solution containing a divalent manganese salt and an organic sulfonic acid is placed in the anode chamber side and an acid is placed in the cathode chamber side to perform electrolytic treatment by using an electrolytic cell separated into the anode chamber and the cathode chamber by a separating membrane, ceramic plate, or the like. Thus, the divalent manganese salt is oxidized in the anode chamber to form a permanganate ion.

In this method, manganese sulfate (II), manganese chloride (II), manganese carbonate (II), etc., can be used as the divalent manganese salt. These divalent manganese salts can be used singly or in a combination of two or more.

The concentration of the divalent manganese salt in the aqueous solution in the anode chamber side can be determined considering that, as described above, the concentration of permanganate ion that can be stably present in the composition for etching treatment of the present invention is about 6 mol % of the total manganese element concentration at the maximum, and the upper limit of the permanganate ion concentration is about 6 mmol/L. For example, even when the concentration of the divalent manganese salt is about 100 mmol/L or more, the concentration of permanganate ion that can be stably present after electrolytic oxidation does not exceed about 6 mmol/L, and sediment tends to be produced by the electrolytic oxidation. Accordingly, the concentration of the divalent manganese salt is preferably about 100 mmol/L or less. The lower limit of the concentration of the divalent manganese salt is determined so that the permanganate ion having the above concentration range can be stably present. Specifically, to stably present about 0.2 mmol/L or more of the permanganate ion, the concentration of the divalent manganese salt is determined as about 3.3 mmol/L or more.

The type and concentration of the organic sulfonic acid in the aqueous solution in the anode chamber side should be the same as those of the target composition for etching treatment.

An acid to be introduced into the cathode chamber side is not particularly limited, and examples include inorganic acids, such as sulfuric acid, hydrochloric acid, nitric acid, phosphoric acid, hydrofluoric acid, and boric acid; aliphatic sulfonic acids having about one to five carbon atoms, such as methane sulfonic acid, ethane sulfonic acid, propane sulfonic acid, and pentane sulfonic acid; aromatic sulfonic acids, such as toluene sulfonic acid, pyridine sulfonic acid, and phenol sulfonic acid; and the like. The acid concentration is generally about 0.01 to 10 mol/L, and these acids can be used singly or in a combination of two or more.

As an anode, it is possible to use electrode materials that have a high enough electrode potential as compared to $Mn^{7+}$, such as Pt, Pt/Ti, Pb, and $PbO_2$. In this case, when the anode potential is lower than +1.51 V (vs SHE), which is the generation potential of $Mn^{2+}$ to $Mn^{7+}$, permanganate ion generation reaction does not occur, and so caution must be taken in this regard.

Any electrode material with durability and sufficient electrical conductivity in an acid solution can be used as the cathode. Usable examples include SUS, Pt, Pt/Ti, Pb, $PbO_2$, Ta, Zr, Fe—Si, etc.

The anode current density during electrolytic oxidation is not particularly limited; however, an anode current density that is too low reduces the permanganate ion generation speed, while an anode current density that is too high increases the load on the equipment due to electrolysis heat. Considering these points, the anode current density is preferably about 1 to 20 A/dm$^2$, and more preferably about 2 to 10 A/dm$^2$.

The bath temperature during electrolytic oxidation is not particularly limited; however, a temperature that is too low reduces the permanganate ion generation speed, while a temperature that is too high increases the load on the equipment. Considering these points, the bath temperature during electrolytic oxidation is preferably about 30 to 70° C., which is a temperature similar to the temperature for etching treatment.

According to the above method, electrolytic treatment may be performed until the permanganate ion having a predetermined concentration range is formed.

(2) Setting the Divalent Manganese Ion Molar Concentration to about 15 Times or More Higher than the Permanganate Ion Molar Concentration In the composition for etching treatment of the present invention, permanganate ion decomposition can be inhibited by setting the divalent manganese ion molar concentration to about 15 times or more higher than the permanganate ion molar concentration while setting the permanganate ion concentration to about 0.2 mmol/L or more and the acid concentration to 10 mol/L or more. As a result, good etching performance on resin materials can be exhibited, bath stability can be significantly improved, and excellent etching performance can be stably exhibited for a long period of time.

As described above, a permanganate ion tends to immediately or gradually decompose in a general aqueous acid solution; however, the composition for etching treatment of the present invention can minimize permanganate ion decomposition by including a divalent manganese ion, which has a molar concentration about 15 times or more higher than the permanganate ion molar concentration, together with the permanganate ion in the bath. Further, the bath stability is also improved, which ensures stable etching performance.

The divalent manganese ion concentration may be about 15 times higher than the target permanganate ion concentration in a molar ratio. For example, when the permanganate ion concentration in the bath is 2 mmol/L, the divalent manganese ion concentration may be determined as about 30 mmol/L or more.

Although the upper molar concentration limit of the divalent manganese compound is not particularly limited, advantageous effects are not attained even when the divalent manganese compound is added in an amount exceeding about 15 times higher than the permanganate ion molar concentration. Accordingly, the addition of an excess amount of the divalent manganese compound is disadvantageous in view of costs. In contrast, when the divalent manganese ion concentration is insufficient, part of the permanganate ion will decompose, which prevents the efficient use of added permanganate ion.

As a process for preparing a composition for etching treatment of the present invention containing a permanganate ion and a divalent manganese ion in the above concentrations, for example, it is possible to apply a method for directly adding a permanganate salt and a divalent manganese salt to form a permanganate ion and a divalent manganese ion in an aqueous solution, and then adding an acid thereto. Compounds used for setting the organic sulfonic acid concentration to 1.5 mol/L or more can be used as the permanganate salt and divalent manganese salt.

However, the addition of the permanganate salt to an aqueous acid solution containing no divalent manganese ion will decompose the permanganate salt, and only up to about 6 mol % of the added permanganate salt can be present in the bath as a permanganate ion; the added permanganate salt is wasted. In contrast, according to the process in which a divalent manganese salt is first dissolved in an aqueous acid solution to prepare an aqueous acid solution containing a predetermined amount of divalent manganese ion, and then a permanganate salt is added to the aqueous acid solution in an amount about 1/15 or less of the divalent manganese ion molar concentration, almost all of the added permanganate salt can be present in the treatment agent as a stable permanganate ion. This process is preferable because it is possible to minimize the amount of the permanganate salt added, which is difficult to handle due to high oxidizability.

(3) Setting the Addition Amount of Anhydrous Magnesium Salt to 0.1 to 1 mol/L

In the composition for etching treatment of the present invention, permanganate ion decomposition can be inhibited and the bath stability can be improved by setting the amount of the anhydrous magnesium salt to about 0.1 to 1 mol/L while determining the permanganate ion concentration as about 0.2 mmol/L or more and the total acid concentration as 10 mol/L or more.

A magnesium ion has an effect of supplementing seven water molecules at the maximum in the bath to form a hydrated ion. For this reason, the addition of anhydrous magnesium salt will decrease activity of water in the bath to slow the reaction of Mn(VII)→Mn(II); consequently, the bath stability may be improved.

Usable examples of the anhydrous magnesium salt include anhydrous magnesium sulfate, anhydrous magnesium chloride, anhydrous magnesium nitrate, etc. These anhydrous magnesium salts can be used singly or in a combination.

The addition amount of the anhydrous magnesium salt is preferably about 0.1 to 1 mol/L, and more preferably about 0.15 to 0.6 mol/L.

Acid Component

As the acid component added to the composition for etching treatment of the present invention, freely selected inorganic and organic acids can be used singly or in a combination of two or more. The inorganic acid is not particularly limited, and examples include sulfuric acid, hydrochloric acid, nitric acid, phosphoric acid, hydrofluoric acid, boric acid, etc. These inorganic acids can be used singly or in a combination of two or more. The organic acid is not particularly limited, and for example, an organic sulfonic acid can be used. Examples of the organic acid include aliphatic sulfonic acids having about one to five carbon atoms, such as methane sulfonic acid, ethane sulfonic acid, propane sulfonic acid, and pentane sulfonic acid; aromatic sulfonic acids such as toluene sulfonic acid, pyridine sulfonic acid, and phenol sulfonic acid; etc. The organic sulfonic acids can be used singly or in a combination of two or more.

The total acid concentration in the composition for etching treatment may be about 10 mol/L or more. The upper limit of the total acid concentration is not limited, and may be the upper limit of the dissolubility of the one or more acid components to be used; however, a large acid component amount is disadvantageous in view of costs. Accordingly, the upper limit of the total acid concentration may be generally about 15 mol/L.

Etching Process

For the etching treatment using the composition of the present invention, the surface of the resin material to be treated is brought into contact with the composition of the present invention. The method is not particularly limited, and any method that brings the surface of the article into sufficient contact with the composition of the invention can be used. For example, a method for spraying the composition of the present invention over the article to be treated may be used. In general, efficient treatment can be achieved by immersing the article into the composition of the invention. In the method of immersion, air stirring, liquid flow using a pump, or shaking of the article can be performed in order to promote oxidation reaction at the surface of the article by the composition.

There is no specific limitation on the shape, size, etc., of the resin material to be treated. A good plating film with excellent appearance and physical properties can be formed even on a large article with a large surface area. Examples of such large resin products include automobile parts and accessories such as radiator grills, hubcaps, medium or small emblems, and door handles; exterior equipment used in the electrical or electronic field; faucet fittings used in places where water is supplied; game machine products such as pachinko components; and the like.

There is no specific limitation on the kind of resin material. A particularly good electroless plating film can be formed on various resin materials that have until now been etched using a chromic acid-sulfuric acid mixture. More specifically, a good electroless plating film can be formed on styrene-containing resins such as acrylonitrile-butadiene-styrene copolymer resins (ABS resins), resins (AAS resins) having an acrylic rubber component in place of the butadiene rubber component of ABS resin, resins (ABS resins) having an ethylene-propylene rubber component in place of the butadiene rubber component of ABS resin, and the like. Examples of resins preferably used also include alloy resins of styrene-containing resins as mentioned above and polycarbonate (PC) resins (for example, alloy resins containing a PC resin in a proportion of about 30 to about 70 wt %). It is also possible to use polyphenylene ether resins, polyphenylene oxide resins, and like resins that have excellent heat resistance and physical properties.

The conditions for etching using the composition for etching treatment of the present invention are not particularly limited. The etching conditions can be suitably selected according to the desired degree of etching. For example, when etching is performed by immersing the article to be treated into the composition for etching treatment, the temperature of the composition may be about 30 to about 70° C., and the immersion time may be about 3 to about 30 minutes.

As described above, to exhibit stable etching performance, etching treatment is preferably performed after the composition for etching treatment that has been produced is allowed to stand at about 30 to 70° C., which is a temperature for using the composition as an etching solution, for about at least one hour to make the permanganate ion concentration stable.

When the surface of the resin material to be treated is extremely dirty, the surface may be degreased according to a usual method before etching.

After the etching treatment is performed, a post-treatment is optionally performed using an inorganic acid to remove manganese from the surface.

The inorganic acid is not particularly limited, and for example, sulfuric acid, hydrochloric acid, nitric acid, phosphoric acid, hydrofluoric acid, and boric acid can be used. These inorganic acids can be used singly or in a combination of two or more.

In general, the concentration of the inorganic acid may be about 0.01 to 10 mol/L. The post-treatment may be performed, for example, by immersion in the inorganic acid of about 15 to about 50° C. for about one to about ten minutes. The appearance of the resulting plating film is thereby improved.

Plating Process

After the etching treatment is performed by the process described above, an electroless plating catalyst is applied according to a usual method to perform electroless plating.

(1) Catalyst Application Process

The process of applying an electroless plating catalyst is not particularly limited. An electroless plating catalyst such as palladium, silver, ruthenium, or the like may be applied according to a known method. For example, representative processes of applying a palladium catalyst include the so-called sensitizing-activating method, catalyzing method, and the like.

Among these methods, the sensitizing-activating method comprises sensitizing a substrate using an aqueous solution containing stannous chloride and hydrochloric acid, and then activating its surface by using an aqueous solution containing a palladium salt such as palladium chloride. The catalyzing method comprises catalyzing a substrate with a mixed colloidal solution containing palladium chloride and stannous chloride, and then activating its surface by using an aqueous sulfuric acid solution, an aqueous hydrochloric acid solution, or the like. Specific processing methods and processing conditions may be according to known methods.

(2) Plating Process

The electroless plating solution may be any known autocatalytic electroless plating solution. Examples of such electroless plating solutions include electroless nickel plating solutions, electroless copper plating solutions, electroless cobalt plating solutions, electroless nickel-cobalt alloy plating solutions, electroless gold plating solutions, and the like.

The electroless plating conditions may be according to known methods. If necessary, two or more layers of electroless plating film may be formed.

After the electroless plating, electroplating may be performed. In this case, after the electroless plating, the surface of the plating film may be optionally activated using an aqueous solution of an acid, alkali, or the like, and then electroplating may be performed. The kind of electroplating solution is not particularly limited. The electroplating solution can be suitably selected from known electroplating solutions according to the purpose.

A plating film with an extremely high adhesion can be formed on a resin material by using the above process.

Other than the above processes, the composition for etching treatment of the present invention can be used for the plating process without performing electroless plating after catalyzation, i.e., direct electroplating process.

Process for Controlling the Composition for Etching Treatment (1) Process for Condensing the Composition for Etching Treatment Since the composition for etching treatment of the present invention has an acid concentration of 10 mol/L or more, which is a relatively high acid concentration in the bath, the volume of the composition sometimes increases by absorbing atmospheric moisture when the etching treatment is performed in an open system. The volume may be also increased by introduction of washing water in the previous step. An increase in the volume of the composition for etching treatment will relatively decrease the concentrations of permanganate ion and acid, which are active ingredients, consequently sometimes reducing etching performance. Accordingly, in order to maintain stable etching performance, it is preferable to inhibit moisture absorption to keep the volume of the composition constant.

According to the present invention, the volume of a composition with a volume that has been increased by moisture absorption can be kept constant by heating to keep the composition at high temperature and by removing moisture in the bath by evaporation. This inhibits reduction in permanganate ion concentration or acid concentration and thereby maintains stable etching performance.

Although the heating temperature is not particularly limited, it is preferably about 70° C. or more, and more preferably about 90° C. or more to ensure efficient moisture removal.

The heating treatment is generally performed in the atmosphere using a freely selected heat source. If necessary, by blowing dry air into the bath, moisture is effectively evaporated to decrease the volume of the composition for etching treatment. The condensation of the composition can be also promoted by heating under reduced pressure.

The timing of the heating treatment is not particularly limited. Heating may be suitably performed according to the use conditions of the composition for etching treatment when the volume of the composition is increased and reduction in etching performance is a concern. The heating may be performed according to the heating treatment conditions until the target degree of the condensation is completed.

By heating the composition for etching treatment of the present invention according to the above process, reduction in permanganate ion concentration or acid concentration can be inhibited, thereby maintaining stable etching performance for a long period of time.

(2) Process for Blowing Ozone Gas into the Composition for Etching Treatment

In the composition for etching treatment of the present invention, a permanganate ion, which is an oxidizer, is reduced in the bath with use and is converted into a divalent or tetravalent manganese ion. Since reduction in permanganate ion concentration is a main cause of reducing etching ability, the permanganate ion concentration is preferably controlled to a specific concentration.

Examples of the method for oxidizing a divalent or tetravalent manganese ion to a permanganate ion include a method of electrolytic oxidation using as an anode a Pt—Ti electrode, diamond electrode, $PbO_2$ electrode, etc., having a high oxygen overvoltage; however, Pt—Ti electrodes and diamond electrodes are costly and unsuitable for industrial use. $PbO_2$ electrodes are problematic because the environmentally harmful substance Pb is used.

In the present invention, by using a process for directly blowing ozone gas with strong oxidizability into the composition for etching treatment, a divalent manganese ion and a tetravalent manganese ion are oxidized to a permanganate ion to inhibit a reduction in permanganate ion concentration in the bath, which enables maintaining stable etching performance. Moreover, since the ozone gas used as an oxidizer is discharged from the system as a harmless oxygen gas, this process is advantageous in view of work environments.

The process for blowing ozone gas into the composition for etching treatment is not particularly limited, and ozone gas may be blown into the bath by using a commercially available ozone generation device. To efficiently advance oxidation reaction with ozone gas, it is preferable to increase the contact area of the ozone gas and the composition for etching treatment. To increase the contact area, it is preferable to blow ozone gas in the form of microbubbles, and a commercially available microbubble generator, etc., can be used for this purpose. Alternatively, ozone gas can be blown as microbubbles by providing a porous material such as pumice to form microscopic pores at the edge of the inlet for blowing ozone gas into the bath.

The size of the ozone gas microbubbles is not particularly limited. To improve the contact efficiency of the ozone gas with the composition for etching treatment, the minimum bubble size is preferable; however, the size is suitably determined considering costs, etc., for generating microbubbles. In general, microbubbles have a size of 100 μm or less, and preferably 1 to 50 μm or less; however, bubbles having a size exceeding 100 μm may be also present in addition to the microbubbles.

The blowing amount, time, etc., of ozone gas are suitably determined in accordance with a specific blowing method so that the target permanganate ion concentration can be obtained.

Thus, continuous reduction in permanganate ion concentration can be inhibited, and stable etching performance can be maintained for a long period of time.

Advantageous Effects of Invention

The composition for etching treatment of resin materials according to the present invention is a highly safe treatment agent containing no highly harmful components such as chromic acid. The composition also enables easy wastewater treatment, makes a small environmental impact, and provides good work environments.

The composition for etching treatment of the present invention has good bath stability and can continuously exhibit good etching performance for a long period of time.

In the composition for etching treatment of the present invention, when the permanganate ion concentration is reduced with its use, or when the acid concentration or permanganate ion concentration is reduced by moisture absorption, heat condensation treatment or ozone gas blowing can be performed, as required, to increase these concentrations to thereby maintain stable etching performance for a long period of time.

DESCRIPTION OF EMBODIMENTS

The Examples below describe the present invention in more detail.

Examples 1 to 6 and Comparative Examples 1 to 4

(1) Production of Composition for Etching Treatment

Using an electrolytic cell separated into an anode chamber and a cathode chamber by a separating membrane, an aqueous solution (500 mL) containing a divalent manganese salt and an organic sulfonic acid according to the composition shown in Table or 2 was introduced into the anode chamber, and a 98% aqueous sulfuric acid solution (250 ml, 300 ml/L) was introduced into the cathode chamber.

Subsequently, electrolytic oxidation was performed at an anode current density of 5 $A/dm^2$ by using a Pt/Ti plate as the anode and an SUS 316 plate as the cathode. With the energization rate in 10-Ah/L increments, the concentration of the permanganate ion in the aqueous solution in the anode chamber was quantified by redox titration using a 2.0 g/L aqueous ascorbic acid solution. After the analysis value of the permanganate ion concentration showed no change and remained constant, the aqueous solution was used as an etching treatment agent. Note that the analysis value (mmol/L) of permanganate ion shown in the tables is the value obtained after remaining constant.

TABLE 1

| Compound | | Example | | | | | |
|---|---|---|---|---|---|---|---|
| | | 1 | 2 | 3 | 4 | 5 | 6 |
| Addition amount (mmol/L) | Manganese sulfate (II) | 7 | | 70 | 35 | | 70 |
| | Manganese carbonate (II) | | 70 | | 35 | 70 | |
| Analysis value of permanganate ion obtained after electrolytic oxidation (mmol/L) | | 0.40 | 4.4 | 4.1 | 4.2 | 4.3 | 4.2 |
| Addition amount (mol/L) | Methane sulfonic acid | 10 | 10 | 6 | 8 | 2 | 4 |
| | Ethane sulfonic acid | | | 4 | | | |
| | P-toluene sulfonic acid | | | | | 2 | |
| | Sulfuric acid | | | | | 8 | 8 |
| | Phosphoric acid | | | | | 2 | |
| Total acid concentration (mol/L) | | 10 | 10 | 10 | 10 | 12 | 12 |

TABLE 2

| Compound | | Comparative Example | | | |
|---|---|---|---|---|---|
| | | 1 | 2 | 3 | 4 |
| Addition amount (mmol/L) | Manganese sulfate (II) | 70 | | 35 | 0.5 |
| | Manganese carbonate (II) | | 70 | 35 | |
| Analysis value of permanganate ion obtained after electrolytic oxidation (mmol/L) | | 0.7 | 4.2 | 4.0 | 0.03 |
| Addition amount (mol/L) | Methane sulfonic acid | 6 | 4 | | 4 |
| | Ethane sulfonic acid | | 2 | | |
| | P-toluene sulfonic acid | | 2 | | |
| | Sulfuric acid | | | 8 | 8 |
| | Phosphoric acid | | | | |
| Total acid concentration (mol/L) | | 6 | 8 | 8 | 12 |

(2) Production of Electroless Plating Film

Flat plates (10 cm×5 cm×0.3 cm, surface area: about 1 dm$^2$) made of ABS resin (trade name: UMG ABS3001M; produced by UMG ABS, Ltd.) were used as substrates to form electroless plating films according to the following method.

The substrates were first immersed in an alkaline degreasing solution (an ACE CLEAN A-220 bath; produced by Okuno Chemical Industries Co., Ltd.) at 40° C. for five minutes and washed with water.

Subsequently, the substrates were immersed in the compositions for etching treatment comprising aqueous solutions produced in Examples 1 to 6 and Comparative Examples 1 to 4. The etching conditions were an immersion temperature of 68° C. and an immersion time of 20 minutes.

After the etching treatment, the substrates were immersed in sulfuric acid (300 ml/L) at 25° C. for one minute and washed with water to remove manganese salt from the surface.

Subsequently, the substrates were immersed in a colloidal palladium-tin catalyst solution (a Catalyst C7 bath; produced by Okuno Chemical Industries Co., Ltd.) at 40° C. for 5 minutes and washed with water.

Subsequently, the substrates were immersed in an activating solution (an aqueous solution containing 100 ml/l of 35% hydrochloric acid) at 40° C. for five minutes, and washed with water.

The substrates were then immersed in an electroless nickel plating solution (a Chemical Nickel SEP-LF bath; produced by Okuno Chemical Industries Co., Ltd.) at 40° C. for five minutes to form electroless nickel plating films.

The bath stability of each composition for etching treatment used in the above process, and the coverage, appearance, and adhesion of each resulting plating film, were evaluated according to the following method. Table 3 shows the test results.

(1) Bath Stability:

The status of each composition for etching treatment was visually observed at regular time intervals after the preparation of the bath, and each composition was examined for the presence or absence of liquid decomposition, suspension, and sediment.

(2) Coverage

The area percentage of the substrate on which an electroless nickel plating film was formed was defined as coverage. Coverage was defined as 100% when the entire surface of the test piece was covered with the plating film.

(3) Appearance:

The appearance of the plating film was evaluated with the naked eye.

(4) Peel Strength Measurement

The electrolessly plated test pieces were subjected to electroplating using a copper sulfate plating bath at a current density of 3 A/dm$^2$ and a temperature of 25° C. for 120 minutes to form copper plating films. The samples thus obtained were dried at 80° C. for 120 minutes and allowed to stand to cool to room temperature. Thereafter, a cut with a width of 10 mm was made in each plating film, and the plating film was pulled in a direction vertical to the resin using a tensile tester (AUTOGRAPH AGS-J 1 kN; produced by Shimadzu Corp.) to determine the peel strength.

(5) Heat Cycle Test

After each electroless nickel plating film was formed under the above conditions, electroplating was performed using a copper sulfate plating bath to a thickness of 10 to 15 μm, a nickel plating bath to a thickness of 10 μm, and a chrome plating bath to a thickness of 0.2 to 0.3 μm, thus preparing test pieces. Using these test pieces, three heat cycles were carried out, each cycle consisting of maintaining the test pieces at −30° C. for one hour, at room temperature for 30 minutes, and at +80° C. for one hour. The test pieces were then checked for appearance by naked eye and evaluated according to the following criteria.

A: No change observed; excellent appearance.
B: Cracking occurred.
C: Blistering of the plating occurred.
—: Not evaluated

TABLE 3

| | Bath stability | Coverage (%) | Appearance | Peel strength (N/cm) | Heat cycle test |
|---|---|---|---|---|---|
| Example 1 | Sediment generated five days after bath preparation | 100 | Good | 6.9 | A |
| Example 2 | Sediment generated five days after bath preparation | 100 | Good | 10.8 | A |
| Example 3 | Sediment generated five days after bath preparation | 100 | Good | 10.3 | A |
| Example 4 | Sediment generated five days after bath preparation | 100 | Good | 10.5 | A |
| Example 5 | Sediment generated seven days after bath preparation | 100 | Good | 12.2 | A |
| Example 6 | Stable seven days after bath preparation | 100 | Good | 12.4 | A |
| Comparative Example 1 | Sediment generated 12 hours after bath preparation | 10 | Poor | Unmeasurable | — |
| Comparative Example 2 | Sediment generated three days after bath preparation | 50 | Poor | 1.7 | — |
| Comparative Example 3 | Sediment generated 16 hours after bath preparation | 45 | Poor | 1.5 | — |
| Comparative Example 4 | Stable seven days after bath preparation | 100 | Good | 3.3 | C |

Examples 7 to 12 and Comparative Examples 5 to 8

Etching treatment was performed in the same manner as in Examples to 6 and Comparative Examples to 4 except that aqueous solutions in which components including a permanganate salt and an organic sulfonic acid shown in Table 4 or 5 were dissolved were used as compositions for etching treatment to form electroless plating films. Each aqueous solution was prepared by simultaneously adding a permanganate salt and an acid in amounts shown in Table 4 or 5 to water for dissolution. The permanganate ion concentration shown in the table was measured after the produced composition for etching treatment was kept for one hour at 68° C. to stabilize the permanganate ion concentration.

TABLE 4

| | | Example | | | | | |
|---|---|---|---|---|---|---|---|
| Compound | | 7 | 8 | 9 | 10 | 11 | 12 |
| Addition amount (mmol/L) | Potassium permanganate (VII) | 7 | | 70 | 35 | | 70 |
| | Sodium permanganate (VII) | | 70 | | 35 | 70 | |
| Analysis value of permanganate ion obtained after stabilization (mmol/L) | | 0.42 | 4.2 | 4.4 | 4.0 | 4.2 | 4.0 |
| Addition amount (mol/L) | Methane sulfonic acid | 10 | 10 | 6 | 8 | 2 | 4 |
| | Ethane sulfonic acid | | | 4 | | | |
| | P-toluene sulfonic acid | | | | | 2 | |
| | Sulfuric acid | | | | | 8 | 8 |
| | Phosphoric acid | | | | | | 2 |
| Total acid concentration (mol/L) | | 10 | 10 | 10 | 10 | 12 | 12 |

TABLE 5

| | | Comparative Example | | | |
|---|---|---|---|---|---|
| Compound | | 5 | 6 | 7 | 8 |
| Addition amount (mmol/L) | Potassium permanganate (VII) | 70 | | 35 | 0.5 |
| | Sodium permanganate (VII) | | 70 | 35 | |
| Analysis value of permanganate ion obtained after stabilization (mmol/L) | | 0.1 | 4.5 | 4.0 | 0.03 |
| Addition amount (mol/L) | Methane sulfonic acid | 6 | 4 | | 4 |
| | Ethane sulfonic acid | | 2 | | |
| | P-toluene sulfonic acid | | 2 | | |
| | Sulfuric acid | | | 8 | 8 |
| | Phosphoric acid | | | | |
| Total acid concentration (mol/L) | | 6 | 8 | 8 | 12 |

The bath stability of each composition for etching treatment used in the above process, and the coverage, appearance, and adhesion of each formed plating film, were evaluated in the same manner as in Examples 1 to 6 and Comparative Examples 1 to 4. Table 6 below shows the test results.

TABLE 6

| | Bath stability | Coverage (%) | Appearance | Peel strength (N/cm) | Heat cycle test |
|---|---|---|---|---|---|
| Example 7 | Sediment generated five days after bath preparation | 100 | Good | 6.1 | A |
| Example 8 | Sediment generated five days after bath preparation | 100 | Good | 10.1 | A |
| Example 9 | Sediment generated five days | 100 | Good | 10.8 | A |

TABLE 6-continued

| | Bath stability | Coverage (%) | Appearance | Peel strength (N/cm) | Heat cycle test |
|---|---|---|---|---|---|
| Example 10 | Sediment generated five days after bath preparation | 100 | Good | 10.8 | A |
| Example 11 | Sediment generated seven days after bath preparation | 100 | Good | 11.9 | A |
| Example 12 | Stable seven days after bath preparation | 100 | Good | 12.2 | A |
| Comparative Example 5 | Decomposition immediately after bath preparation | Not evaluated | | | |
| Comparative Example 6 | Sediment generated 12 hours after bath preparation | 50 | Poor | 1.6 | — |
| Comparative Example 7 | Sediment generated eight hours after bath preparation | 50 | Poor | 1.3 | — |
| Comparative Example 8 | Stable seven days after bath preparation | 100 | Good | 3.3 | C |

As is clear from the results, the compositions for etching treatment of Examples 1 to 12 each having a permanganate ion concentration of 0.2 mmol/L or more, an organic sulfonic acid concentration of 1.5 mol/L or more, and a total acid concentration of 10 mol/L or more were confirmed to have good stability in both cases, i.e., when produced by the electrolyzing method (Examples 1 to 6) and when produced by direct addition of a permanganate salt (Examples 7 to 12). Further, plating films obtained by performing etching treatment using these compositions had high coverage, good appearance, and excellent adhesion.

In contrast, the compositions for etching treatment of Comparative Examples 1 to 3 and 5 to 7 having a total acid concentration below 10 mol/L had poor bath stability in both cases, i.e., when produced by the electrolyzing method (Comparative Examples 1 to 3) and when produced by direct addition of a permanganate salt (Comparative Examples 5 to 7), and the resulting films had poor coverage and adhesion.

Although the compositions for etching treatment of Comparative Examples 4 and 8 had an organic sulfonic acid concentration of 1.5 mol/L or more and a total acid concentration of 10 mol/L or more, etching performance was poor due to the low concentration of the permanganate salt, and the resulting films had poor adhesion.

Examples 13 to 18 and Comparative Examples 9 to 12

(1) Production of Composition for Etching Treatment

Aqueous solutions (500 mL) having the composition shown in Table 7 or 8 were prepared. Specifically, an acid component (methanesulfonic acid and/or sulfuric acid) and a divalent manganese salt (manganese sulfate and/or manganese carbonate) in amounts shown in Table 7 or 8 below were added to water to prepare aqueous acid solutions containing these components. Subsequently, a permanganate salt (potassium permanganate and/or sodium permanganate) was added to each aqueous solution in an amount shown in the table. The resultant was kept at 68° C. for one hour and stabilized, and then used as a composition for etching treatment. Tables 7 and 8 show the results of the permanganate ion concentration in the bath after stabilization, the concentration being obtained by redox titration using an aqueous ascorbic acid solution.

TABLE 7

| | | Example | | | | | |
|---|---|---|---|---|---|---|---|
| Compound | | 13 | 14 | 15 | 16 | 17 | 18 |
| Addition amount (mmol/L) | Manganese sulfate (II) | 6 | | 100 | 50 | | 100 |
| | Manganese carbonate (II) | | 75 | | 25 | 75 | |
| | Potassium permaganate (VII) | 0.4 | | 5 | 2.5 | | 5 |
| | Sodium permanganate (VII) | | 5 | | 2.5 | 5 | |
| Analysis value of permanganate ion obtained after stabilization (mmol/L) | | 0.4 | 4.5 | 4.9 | 4.4 | 4.5 | 4.7 |
| Addition amount (mol/L) | Methane sulfonic acid | | | | 10 | 2 | 4 |
| | Sulfuric acid | 10 | 10 | 12 | | 8 | 8 |
| Total acid concentration (mol/L) | | 10 | 10 | 12 | 10 | 10 | 12 |

TABLE 8

| | | Comparative Example | | | |
|---|---|---|---|---|---|
| Compound | | 9 | 10 | 11 | 12 |
| Addition amount (mmol/L) | Manganese sulfate (II) | 8 | 25 | | |
| | Manganese carbonate (II) | | 25 | 100 | 2 |
| | Potassium permaganate (VII) | 0.8 | | 5 | 0.1 |
| | Sodium permanganate (VII) | | 5 | | |
| Analysis value of permanganate ion (mmol/L) | | 0.4 | 2.5 | 3.4 | 0.1 |
| Addition amount (mol/L) | Methane sulfonic acid | 6 | 6 | | |
| | Sulfuric acid | | | 8 | 12 |
| Total acid concentration (mol/L) | | 6 | 6 | 8 | 12 |

The bath stability of each composition for etching treatment used in the above process, and the coverage, appearance, and adhesion of each resulting plating film, were evaluated in the same manner as in Examples 1 to 6 and Comparative Examples 1 to 4. Table 9 shows the test results.

TABLE 9

|  | Bath stability | Coverage (%) | Appearance | Peel strength (N/cm) | Heat cycle test |
|---|---|---|---|---|---|
| Example 13 | Sediment generated five days after bath preparation | 100 | Good | 7.1 | A |
| Example 14 | Sediment generated five days after bath preparation | 100 | Good | 10.4 | A |
| Example 15 | Sediment generated five days after bath preparation | 100 | Good | 11.3 | A |
| Example 16 | Sediment generated five days after bath preparation | 100 | Good | 10.5 | A |
| Example 17 | Sediment generated seven days after bath preparation | 100 | Good | 11.2 | A |
| Example 18 | Stable seven days after bath preparation | 100 | Good | 12.1 | A |
| Comparative Example 9 | Sediment generated 12 hours after bath preparation | 30 | Poor | 0.9 | — |
| Comparative Example 10 | Sediment generated 12 hours after bath preparation | 40 | Poor | 1.7 | — |
| Comparative Example 11 | Sediment generated 24 hours after bath preparation | 80 | Poor | 5.9 | — |
| Comparative Example 12 | Stable seven days after bath preparation | 10 | Poor | Unmeasurable | C |

As is clear from the results, the compositions for etching treatment of Examples 13 to 18 each having a permanganate ion concentration of 0.2 mmol/L or more, a divalent manganese ion molar concentration 15 times or more higher than the permanganate ion molar concentration, and a total acid concentration of 10 mol/L or more were confirmed to have good stability. Further, plating films obtained by performing etching treatment using these compositions had high coverage, good appearance, and excellent adhesion.

In contrast, the compositions for etching treatment of Comparative Examples 9 to 11 having a total acid concentration below 10 mol/L had poor bath stability, and the resulting films had poor coverage and adhesion.

Although the composition for etching treatment of Comparative Example 12 had a divalent manganese ion molar concentration 15 times or more higher than the permanganate ion molar concentration, and had a total acid concentration of 10 mol/L or more, etching performance was poor due to the low permanganate ion concentration, and the resulting film had remarkably poor coverage.

Examples 19 to 24

(1) Production of Composition for Etching Treatment

Aqueous solutions (500 mL) each having the composition shown in Table 10 were prepared. Specifically, an acid component (methanesulfonic acid and/or sulfuric acid) and an anhydrous magnesium salt (anhydrous magnesium sulfate, anhydrous magnesium chloride, or anhydrous magnesium nitrate) in amounts shown in Table 10 below were added to water to prepare aqueous acid solutions containing these components. Subsequently, a permanganate salt (potassium permanganate and/or sodium permanganate) was added to each aqueous solution in an amount shown in the table. The resultant was kept at 68° C. for one hour and stabilized, and then used as a composition for etching treatment. Table 10 shows the results of the permanganate ion concentration in the bath after stabilization, the concentration being obtained by redox titration using an aqueous ascorbic acid solution.

TABLE 10

|  | Compound | Example 19 | Example 20 | Example 21 | Example 22 | Example 23 | Example 24 |
|---|---|---|---|---|---|---|---|
| Addition amount (mmol/L) | Manganese sulfate (II) |  | 6 |  | 100 | 50 |  |
|  | Manganese carbonate (II) |  |  | 75 |  | 25 | 75 |
|  | Potassium permaganate (VII) | 70 | 0.4 |  | 5 | 2.5 |  |
|  | Sodium permanganate (VII) |  | 5 |  |  | 2.5 | 5 |
| Analysis value of permanganate ion obtained after stabilization (mmol/L) |  | 4.5 | 0.4 | 4.6 | 4.9 | 4.8 | 4.7 |
| Addition amount (mol/L) | Methane sulfonic acid |  |  |  |  | 10 | 2 |
|  | Sulfuric acid | 12 | 10 | 10 | 12 |  | 8 |
|  | Anhydrous magnesium sulfate | 0.5 |  |  |  | 0.2 |  |
|  | Anhydrous magnesium chloride |  | 0.2 |  | 0.5 |  | 0.2 |
|  | Anhydrous magnesium nitrate |  |  | 0.2 |  |  |  |

The bath stability of each composition for etching treatment used in the above process, and the coverage, appearance, and adhesion of each resulting plating film were evaluated in the same manner as in Examples 1 to 6 and Comparative Examples 1 to 4. Table 11 shows the test results.

TABLE 11

|  | Bath stability | Coverage (%) | Appearance | Peel strength (N/cm) | Heat cycle test |
|---|---|---|---|---|---|
| Example 19 | Sediment generated seven days after bath preparation | 100 | Good | 10.1 | A |
| Example 20 | Stable seven days | 100 | Good | 11 | A |

TABLE 11-continued

|  | Bath stability | Coverage (%) | Appearance | Peel strength (N/cm) | Heat cycle test |
|---|---|---|---|---|---|
| Example 21 | Stable seven days after bath preparation | 100 | Good | 11.1 | A |
| Example 22 | Stable seven days after bath preparation | 100 | Good | 10.9 | A |
| Example 23 | Stable seven days after bath preparation | 100 | Good | 11.8 | A |
| Example 24 | Stable seven days after bath preparation | 100 | Good | 11.2 | A |

As is clear from the results, the compositions for etching treatment of Examples 19 to 24 each having a permanganate ion concentration of 0.2 mmol/L or more and a total acid concentration of 10 mol/L or more, and having an addition amount of anhydrous magnesium salt of 0.1 to 1 mol/L were confirmed to have good stability. Further, plating films obtained by performing etching treatment using these compositions had high coverage, good appearance, and excellent adhesion.

Example 25

The composition for etching treatment containing components in amounts shown in Table 12 was prepared in the same manner as in Examples 7 to 12, and the specific gravity of the composition immediately after bath preparation was measured.

TABLE 12

| Addition amount (mol/L) | Sodium permanganate (VII) | 0.07 |
|---|---|---|
|  | Methane sulfonic acid | 4 |
|  | Sulfuric acid | 8 |
| Specific gravity (immediately after bath preparation) |  | 1.58 |

The composition for etching treatment was allowed to stand in an atmosphere at 25° C. for 48 hours, and heat condensation was performed on the bath whose volume was increased to 109% based on the volume immediately after bath preparation. The specific gravity of the composition after the heat condensation was then measured. According to the measured specific gravity, the ratio of the volume of the composition after heating treatment was obtained based on the volume of the composition immediately after bath preparation (100%). Table 13 shows the results.

In the table, dry-air blowing shown in the column of heating conditions is a treatment of blowing dry air, which had been prepared by using silica gel and calcium chloride, at a flow rate of 1.0 L/m into the composition for etching treatment. Heating treatment was performed under atmospheric pressure or reduced pressure of 0.07 MPa.

TABLE 13

| | Heating conditions | | | | | |
|---|---|---|---|---|---|---|
| | Temperature (° C.) | Treatment time (hour) | Dry-air blowing | Atmosphere (MPa) | Specific gravity | Volume (%) |
| Before treatment (bath allowed to stand at 25° C. for 48 hours) | | | | | 1.53 | 109 |
| Test Example 1 | 70 | 60 | Without dry-air blowing | 0.10 (atmospheric pressure) | 1.58 | 100 |
| Test Example 2 | | | | 0.07 | 1.59 | 98 |
| Test Example 3 | | | Dry-air blowing | 0.10 (atmospheric pressure) | 1.59 | 98 |
| Test Example 4 | | | | 0.07 | 1.61 | 95 |
| Test Example 5 | 90 | 6 | Without dry-air blowing | 0.10 (atmospheric pressure) | 1.58 | 100 |

As is clear from the above results, as compared with the specific gravity before heating treatment, the specific gravity obtained after heating treatment at a temperature of 70° C. or more increased, and an effect of condensing the composition for etching treatment, the volume of which was increased by moisture absorption, was acknowledged. In addition, a tendency was observed in which the concentration efficiency increased as the treating temperature was high, and the combination use of dry-air blowing or heating treatment under reduced pressure was confirmed to ensure efficient condensation.

Example 26

The test solution containing components in amounts shown in Table 14 was prepared.

TABLE 14

| Addition amount (mol/L) | Manganate sulfate (II) | 0.07 |
|---|---|---|
|  | Methane sulfonic acid | 4 |
|  | Sulfuric acid | 8 |

Using a commercially available ozone generation device, ozone gas was blown into the test solution (1 L) for one hour, and the concentration of permanganate ion generated in the bath was obtained by ascorbic acid titration. The yield of ozone gas was 200 mg/h or 1000 mg/h, and the blowing amount was 2 L/min.

Ozone gas was blown by using either of the following methods: a method of blowing ozone gas by using a glass tube with a tip diameter of 1.5 mm (general bubbling) or a method of blowing ozone gas in microbubble form by providing the end of the glass tube with pumice having a diameter of about 30 μm (microbubbling).

As a comparative test, the concentration of permanganate ion obtained by blowing air at an air flow rate of 2 L/min for one hour in place of ozone gas was measured in the bath. Table 15 blow shows the results.

TABLE 15

| | Ozone yield (mg/H) | Treatment temperature (° C.) | Bubbling method | Permanganate ion concentration (mg/L) |
|---|---|---|---|---|
| Test Example 1 | 200 | 25 | General bubbling | 1.5 |
| Test Example 2 | | | Microbubbling | 7.5 |
| Test Example 3 | | 50 | Microbubbling | 12 |
| Test Example 4 | | 70 | Microbubbling | 15 |
| Test Example 5 | 1000 | 25 | General bubbling | 7.5 |
| Test Example 6 | | | Microbubbling | 37.5 |
| Test Example 7 | | 50 | Microbubbling | 60 |
| Test Example 8 | | 70 | Microbubbling | 75 |
| Comparative Test Example 1 | 0 (air stirring) | 25 | General bubbling | 0 |
| Comparative Test Example 2 | | | Microbubbling | 0 |
| Comparative Test Example 3 | | 50 | Microbubbling | 0 |
| Comparative Test Example 4 | | 70 | Microbubbling | 0 |

The above results clearly indicated that the permanganate ion was generated by blowing ozone gas into the aqueous solution containing manganese sulfate, methane sulfonic acid, and sulfuric acid. In particular, the yield of permanganate ion was greatly increased by increasing the bath temperature and blowing ozone gas as microbubbles.

In contrast, a permanganate ion was not generated when air was blown as microbubbles in place of ozone gas.

The results confirmed that when the permanganate ion concentration is reduced with use, the concentration can be increased by blowing ozone gas.

The invention claimed is:

1. A composition for etching treatment of a resin material, the composition comprising an aqueous solution having a permanganate ion concentration of 0.2 mmol/L or more and a total acid concentration of 10 mol/L or more, and
   the aqueous solution satisfying at least one of the following conditions (1) to (3):
   (1) containing an organic sulfonic acid in an amount of 1.5 mol/L or more,
   (2) containing a divalent manganese ion in a molar concentration of 15 or more times higher than the permanganate ion molar concentration, and
   (3) containing an anhydrous magnesium salt in an amount of 0.1 to 1 mol/L.

2. The composition according to claim 1, wherein the permanganate ion is formed by subjecting a divalent manganese ion to electrolytic oxidation in the aqueous solution.

3. The composition according to claim 1, wherein the permanganate ion is formed by dissolving a permanganate salt in the aqueous solution.

4. The composition according to claim 1, wherein the aqueous solution satisfies condition (1), and the organic sulfonic acid is an aliphatic sulfonic acid having one to five carbon atoms.

5. The composition according to claim 1, wherein the aqueous solution satisfies condition (2), and the aqueous solution is prepared by adding a permanganate salt to an aqueous acid solution containing a divalent manganese ion.

6. The composition according to claim 1, wherein the aqueous solution satisfies condition (3), and the anhydrous magnesium salt is at least one member selected from the group consisting of anhydrous magnesium sulfate, anhydrous magnesium chloride, and anhydrous magnesium nitrate.

7. The composition according to claim 1, wherein the aqueous solution satisfies condition (3).

8. An etching treatment process of a resin material, comprising bringing the composition according to claim 1 into contact with a surface of a resin material to be treated.

9. A process for plating a resin material, comprising etching the resin material by the process of claim 8, then applying an electroless plating catalyst, and subsequently performing electroless plating.

10. A process for controlling the composition according to claim 1, the process comprising condensing the composition by heating when the volume of the composition is increased.

11. A process for controlling the composition according to claim 1, the process comprising blowing ozone gas into the composition when the permanganate ion concentration in the composition is decreased.

12. The composition according to claim 2, wherein the aqueous solution satisfies condition (1), and the organic sulfonic acid is an aliphatic sulfonic acid having one to five carbon atoms.

13. The composition according to claim 3, wherein the aqueous solution satisfies condition (1), and the organic sulfonic acid is an aliphatic sulfonic acid having one to five carbon atoms.

14. An etching treatment process of a resin material, comprising bringing the composition according to claim 2 into contact with a surface of a resin material to be treated.

15. An etching treatment process of a resin material, comprising bringing the composition according to claim 3 into contact with a surface of a resin material to be treated.

16. An etching treatment process of a resin material, comprising bringing the composition according to claim 4 into contact with a surface of a resin material to be treated.

17. An etching treatment process of a resin material, comprising bringing the composition according to claim 5 into contact with a surface of a resin material to be treated.

18. An etching treatment process of a resin material, comprising bringing the composition according to claim 6 into contact with a surface of a resin material to be treated.

19. A process for controlling the composition according to claim 2, the process comprising condensing the composition by heating when the volume of the composition is increased.

20. A process for controlling the composition according to claim 3, the process comprising condensing the composition by heating when the volume of the composition is increased.

21. A process for controlling the composition according to claim 4, the process comprising condensing the composition by heating when the volume of the composition is increased.

* * * * *